US006487124B2

United States Patent
Semi

(10) Patent No.: US 6,487,124 B2
(45) Date of Patent: Nov. 26, 2002

(54) NONVOLATILE SEMICONDUCTOR STORAGE DEVICE CAPABLE OF CORRECTLY READING SELECTED MEMORY CELL AND READ METHOD

(75) Inventor: Atsushi Semi, Matsubara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/955,016

(22) Filed: Sep. 19, 2001

(65) Prior Publication Data
US 2002/0034101 A1 Mar. 21, 2002

(30) Foreign Application Priority Data
Sep. 20, 2000 (JP) ........................................ 2000-285156

(51) Int. Cl.[7] .............................................. G11C 16/06
(52) U.S. Cl. ................... 365/185.25; 365/203
(58) Field of Search ........................ 365/185.25, 203, 365/185.01, 189.01

(56) References Cited

U.S. PATENT DOCUMENTS

| 5,001,668 | A | * | 3/1991 | Ito et al. | 365/185.21 |
| 5,229,968 | A | * | 7/1993 | Ito et al. | 365/185.06 |
| 5,768,184 | A | * | 6/1998 | Hayashi et al. | 365/185.03 |
| 5,875,128 | A | | 2/1999 | Ishizuka | |
| 6,081,456 | A | * | 6/2000 | Dadashev | 365/185.23 |
| 6,147,904 | A | * | 11/2000 | Liron | 365/185.03 |
| 6,218,695 | B1 | * | 4/2001 | Nachumovsky | 257/296 |

FOREIGN PATENT DOCUMENTS

| JP | 6-68683 | 3/1994 |
| JP | 10-11991 | 1/1998 |

* cited by examiner

Primary Examiner—Hoai Ho
(74) Attorney, Agent, or Firm—Morrison & Foerster LLP

(57) ABSTRACT

A selected memory cell is correctly read even when a threshold value of a non-selected memory cell that shares a word line is low. When reading a memory cell MC12, a discharge transistor select circuit 47 selectively discharges a bit line BL2 connected to the memory cell MC12 and two bit lines BL0 and BL1 that are adjacent to the bit line BL2. A precharge control circuit 46 fixes to a precharge voltage a center bit line among five bit lines that include a bit line BL3 connected to the memory cell MC12 and four bit lines that are adjacent to the bit line BL3 and brings the remaining bit lines into a floating state with the precharge voltage. Thus, the potential of the bit line BL3 is prevented from being lowered as a consequence of a leak current occurring via the non-selected memory cell MC when the threshold value of the selected memory cell MC12 is high, by which the erroneous determination that the ON-state is provided is prevented from being made.

5 Claims, 7 Drawing Sheets

NONVOLATILE SEMICONDUCTOR STORAGE DEVICE CAPABLE OF CORRECTLY READING SELECTED MEMORY CELL AND READ METHOD

BACKGROUND OF THE INVENTION

The present invention relates to a nonvolatile semiconductor storage device of a virtual ground system and a read method for the nonvolatile semiconductor storage device.

There has conventionally been known a semiconductor storage device intended for preventing the flow of a current from a word line to a bit line and a virtual GND line (Japanese Patent Laid-Open Publication No. HEI 6-68683). In this semiconductor storage device, as shown in FIG. 7, memory cell transistors are connected in an array form to bit lines 1 through 4 and virtual GND lines 5 through 9. Moreover, metal bit lines 10 through 12 are provided commonly for two bit lines of each block constructed of two bit lines (bit lines 2 and 3, for example). A precharge circuit 17, which has transistors 14 through 16 connected to the metal bit lines 10 through 12, respectively, is arranged between a Y gate 13 and the memory cell array.

Metal virtual GND lines 18 and 19 are provided one per block constructed of adjoining two virtual GND lines (virtual GND lines 6 and 7, for example). The metal virtual GND lines 18 and 19 are connected to precharge select circuits 20 and 21, respectively. It is to be noted that reference numerals 22 and 23 denote bit line select lines, numerals 24 and 25 denote virtual GND line select lines, and a numeral 26 denotes a word line.

When, for example, a memory cell transistor 27 is read in the semiconductor storage device that has the aforementioned construction, the voltages of the word line 26, the virtual GND line select line 24 and the bit line select line 22 are pulled up to a Vcc level. The voltages of the virtual GND line select line 25 and the bit line select line 23 are pulled down to the GND level. In the above case, only the voltage of the metal virtual GND line 18 is pulled down to the GND level by the precharge select circuit 20, while the voltages of all the other virtual GND lines 19 are set to a precharge level by the precharge select circuit 21. By this operation, only the voltages of the two virtual GND lines 6 and 7 that constitute one block come to have the GND level, while the voltages of other virtual GND lines 5, 8 and 9 come to have the precharge level. Moreover, the metal bit line 11 is selected by a Y gate 13. In the above case, the voltage of the bit line select line 22 has the Vcc level, and the bit line select line 23 has the GND level, as described above. Consequently, a transistor 28 is turned OFF, and a transistor 29 is turned ON. Therefore, the bit line 3 is connected to the metal bit line 11 via the transistor 29 so as to be put in a selected state. By this operation, the memory cell transistor 27 is brought into the selected state.

There is another semiconductor storage device as shown in FIG. 8, in which the current from the word line is prevented from flowing into the bit line and the virtual GND line (Japanese Patent Laid-Open Publication No. HEI 10-11991). As shown in FIG. 8, this semiconductor storage device is constituted roughly of a NOR type cell array constructed of memory cell transistors M01 through Mn8, a select circuit 31, a precharge circuit 32, a sense amplifier 33, a select circuit 34, a precharge circuit 35 and so on. There are further provided bit lines and virtual GND lines D1 through D9, word lines WD0 through WDn, bit-line select transistors S1 through S6, virtual GND line select transistors S11 through S17, bit line select lines BS0 and BS1 and virtual GND line select lines BS2 and BS3.

Furthermore, bit line select circuits SEL1 and SEL2, which are respectively constructed of three bit line select transistors S1 through S3 and S4 through S6, are connected to memory cell transistors M arranged in four columns and select the bit lines and virtual GND lines D in units of columns. Among the bit line select transistors S1, S2 and S3 that constitute the bit line select circuit SEL1, the bit line select transistors S1 and S3 have their gates commonly connected to a bit line select line BS0, have their sources connected to a select circuit 31 via a bit line Y1 and have their drains connected to the bit lines and virtual GND lines D2 and D4. The bit line select transistor S2 has its gate connected to a bit line select line BS1, has its source connected to a select circuit 31 via a bit line Y1 and has its drain connected to the bit line and virtual GND line D3.

When, for example, the memory cell transistor M01 is read in the semiconductor storage device having the aforementioned construction, the voltages of the word line WD0 connected to the gate of the memory cell transistor M01, the bit line select line BS0 connected to the gate of the bit line select transistor S1 whose drain is connected to the drain (or source) of the memory cell transistor M01 and the virtual GND line select line BS3 connected to the gate of the virtual GND line select transistor S11 whose drain is connected to the source (or drain) of the memory cell transistor M01 are pulled up to the VCC level, turning ON the bit line select transistor S1 and the virtual GND line select transistor S11.

At the same time, the voltages of the bit line select line BS1 and the virtual GND line select line BS2 are pulled down to the GND level, turning OFF the bit line select transistors S2 and S5 and the virtual GND line select transistors S12, S13, S15 and S16. The select circuit 31 connects the bit line Y1 to the sense amplifier 33 and connects the bit line Y2 to the precharge circuit 32. Furthermore, the select circuit 34 connects a virtual GND line VG1 to the virtual GND and connects the virtual GND lines VG2 and VG3 to the precharge circuit 35.

Therefore, the bit line Y1 and the bit line and virtual GND line D2 are connected together by the bit line select transistor S1 turned ON. The virtual GND line VG1 and the bit line and virtual GND line D1 are connected together by the virtual GND line select transistor S11 turned ON. As a result, among the bit line and virtual GND lines D1 and D2, the line "D2" becomes the bit line, and the line "D1" becomes the virtual GND line, bringing the memory cell transistor M01 into the selected state.

However, the conventional semiconductor storage device of the virtual GND system has the problem that misread will possibly occur due to a leak current from the memory cell transistors 30 and M04, which share the word lines WL and WD0 with the memory cell transistors 27 and M01.

First of all, in the case of the aforementioned semiconductor storage device of Japanese Patent Laid-Open Publication No. HEI 6-68683, when the memory cell transistor 27 is selected in FIG. 7, the voltage of the virtual GND line 8 is also pulled up to the precharge level Vpc since the virtual GND line select line 24 has the voltage level of Vcc. Therefore, when the memory cell transistor 30 is ON, a superfluous current flows into the metal bit line 11 through the memory cell transistor 30, as a consequence of which the reduction in the potential of the metal bit line 11 is hindered when the memory cell transistor 27 is ON, possibly causing an operation as if the memory cell transistor 27 were an OFF cell.

Next, in the case of the aforementioned semiconductor storage device of Japanese Patent Laid-Open Publication No. HEI 10-11991, when the memory cell transistor M01 is selected in FIG. 8, the bit line select transistor S3 is also turned ON concurrently with the turning-on of the bit line select transistor S1. In this case, when the memory cell transistor M04 connected to the selected word line WD0 is ON, a current flows into the bit line Y1 via the memory cell transistor M04 and the bit line select transistor S3 since the non-selected bit line D5 has the precharge level, as a consequence of which the reduction in the potential of the bit line Y1 is prevented when the memory cell transistor M01 is ON, possibly causing an operation as if the memory cell transistor M01 were an OFF cell.

SUMMARY OF THE INVENTION

Accordingly, the object of the present invention is to provide a nonvolatile semiconductor storage device of the virtual ground system in which the selected memory cell can correctly be read even when the threshold value of the non-selected memory cell that shares a word line WL with this selected memory cell is low and a read method therefor.

In order to achieve the aforementioned object, there is provided a nonvolatile semiconductor storage device having a plurality of nonvolatile memory cells arranged in a matrix form and bit lines and word lines connected to the nonvolatile memory cells, the nonvolatile memory cells adjoining in a direction in which the word lines extend sharing one bit line, the device comprising:

- a full bit precharge means for charging all the bit lines with electric charges;
- a selective discharge means for selectively discharging one or more adjoining bit lines that include either one of two bit lines connected to a selected nonvolatile memory cell;
- a selective precharge means for selectively applying a precharge voltage to any one of one or more bit lines adjacent to the other bit line of the two bit lines connected to the selected nonvolatile memory cell;
- a precharge control circuit for operating the full bit precharge means during full bit precharge for charging all the bit lines and operating the selective precharge means in a read operation; and
- a discharge control circuit for operating the selective discharge means in the read operation.

According to the above-mentioned construction, when reading the stored information of the selected memory cell, the full bit precharge means is first operated by the precharge control circuit so as to charge the full bit line. All the bit lines are brought into the floating state in the above state, and thereafter, the selective discharge means is operated by the discharge control circuit so as to selectively discharge one or more adjoining bit lines that include either one bit line of the two bit lines connected to the selected memory cell. Furthermore, the selective precharge means is operated by the precharge control circuit so as to selectively apply the precharge voltage to any one of the one or more bit lines adjacent to the other bit lines.

By the above operation, the current leak via the non-selected memory cell from the drain of the selected memory cell is prevented even when the threshold value of the selected memory cell is high and the threshold value of the non-selected memory cell is low, and the potential of the drain is kept at the precharge potential. Thus, correct read is executed. When the threshold value of the selected memory cell is low and the threshold value of the non-selected memory cell is low, the drain of the selected memory cell is charged with electric charges from the selectively precharged bit line. However, before receiving the influence of the charges, the precharge potential of the other bit line is pulled down to one-third, for example, by the bit line located on the one discharged side. Thus, the correct read is executed.

That is, no misread occurs since the other bit line is provided with a sufficient potential difference between the potential when the threshold value of the selected memory cell is high and the potential when the threshold value is low even if the sense timing of the other bit line connected to the selected memory cell is delayed for some reasons.

In one embodiment, the bit line to which the precharge voltage is applied by the selective precharge means is one bit line located at a center of the plurality of adjoining bit lines that include the other bit line.

According to the above-mentioned construction, the drain potential when the threshold value of the selected memory cell is high does not receive the influence of the current leak occurring from the precharge voltage applied bit line toward the discharged bit line via the non-selected memory cell, dissimilar to the case where the bit line to which the precharge voltage is applied is positioned on the opposite side of the selected memory cell with respect to the center of the plurality of adjoining bit lines that include the other bit line. The drain voltage when the threshold value of the selected memory cell is low does not receive the influence of the electric charges occurring from the precharge voltage applied bit line via the non-selected memory cell, dissimilar to the case where the precharge voltage applied bit line is positioned on the selected memory cell side with respect to the center.

In one embodiment, the bit lines, which are selectively discharged by the selective discharge means, are three bit lines, and the plurality of bit lines, where the bit line to which the precharge voltage is applied by the selective precharge means is located at the center, are five bit lines.

In one embodiment, each of the full bit precharge means, the selective precharge means and the selective discharge means is constituted of a plurality of transistors whose sources or drains are connected to the bit lines, the precharge control circuit supplies a control signal to gates of the transistors that constitute the full bit precharge means and the selective precharge means, and the discharge control circuit supplies a control signal to gates of the transistors that constitute the selective discharge means.

According to the above-mentioned construction, the full bit precharge means, the selective precharge means and the selective discharge means are constituted by arranging same transistors in a line. Therefore, the area occupied by the above-mentioned means is reduced. Furthermore, the selective discharge of the bit line and the selective application of the precharge voltage are executed in units of individual bit lines. Therefore, the number of the discharged bit lines, the number of the non-discharged bit lines and the position of the precharge voltage applied bit line can easily be changed only by changing the precharge control circuit or the discharge control circuit.

There is provided a method for reading a nonvolatile semiconductor storage device having a plurality of nonvolatile memory cells arranged in a matrix form and bit lines and word lines connected to the nonvolatile memory cells, the nonvolatile memory cells adjoining in a direction in which the word lines extend sharing one bit line, the method comprising the steps of:

precharging all the bit lines with electric charges;

activating a word line connected to a selected nonvolatile memory cell;

selectively discharging one or more adjoining bit lines that include either one of two bit lines connected to the selected nonvolatile memory cell;

selectively applying a precharge voltage to one bit line that is located at a center of a plurality of adjoining bit lines that include the other bit line of the two bit lines connected to the selected nonvolatile memory cell; and reading information stored in the selected nonvolatile memory cell from the other bit line.

According to the above-mentioned construction, similarly to the case of the first inventive aspect, when the threshold value of the selected memory cell is high and the threshold value of the non-selected memory cell is low, the current leak occurring from the drain of the selected memory cell via the non-selected memory cell is prevented since the precharge voltage is applied to the one bit line located at the center of the non-discharged bit lines, and the potential of the drain is kept at the precharge potential. Thus, the correct read is executed. When the threshold value of the selected memory cell is low and the threshold value of the non-selected memory cell is low, the precharge potential of the other bit line is pulled down by the discharged one bit line before the drain potential of the selected memory cell receives the influence of the electric charges from the precharge voltage applied bit line. Thus, the correct read is executed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
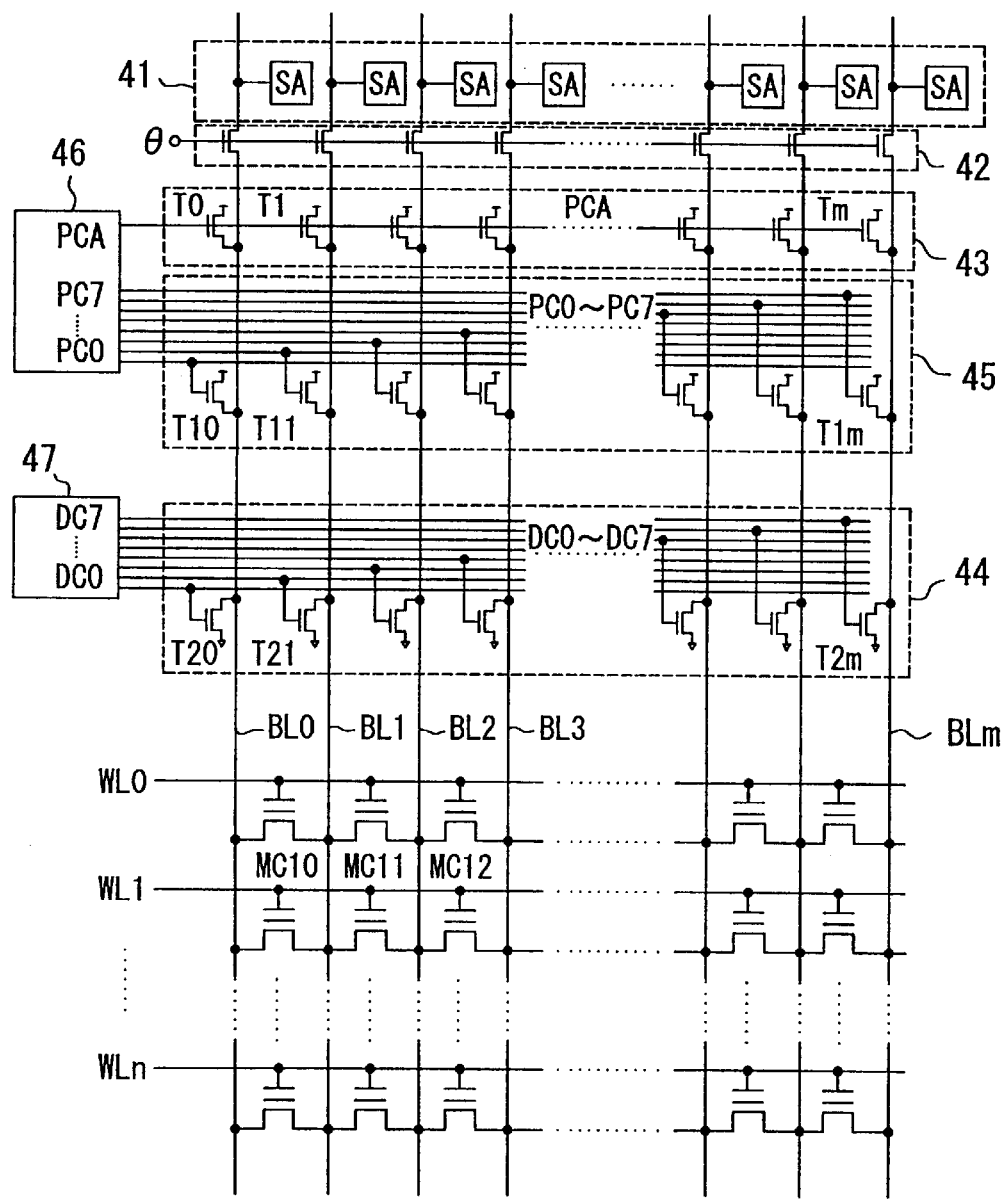
FIG. 1 is a block diagram of a nonvolatile semiconductor storage device according to the present invention.

The present invention will be described in detail below on the basis of embodiments thereof shown in the drawings.

FIG. 1 is a block diagram of a nonvolatile semiconductor storage device of a virtual ground system of the present embodiment. In FIG. 1, the present nonvolatile semiconductor storage device has (m×n) memory cell transistors MC (hereinafter simply referred to as memory cells. MC represents MC10, MC11, MC12, ...) arranged in a matrix form, a sense amplifier circuit 41 constructed of sense amplifiers SA connected to bit lines BL, a switching circuit 42 for connection and disconnection between the sense amplifier circuit 41 and the bit lines BL, a full bit precharge circuit 43 for precharging all the bit lines BL, a selective discharge circuit 44 for selectively discharging three bit lines BL out of eight bit lines BL in one block, a selective precharge circuit 45 for selectively applying a precharge voltage to one bit line BL located at the center of the five bit lines BL other than the three bit lines BL discharged by the selective discharge circuit 44, a precharge control circuit 46 for controlling the operations of the full bit precharge circuit 43 and the selective precharge circuit 45, and a discharge transistor select circuit 47 for controlling the operation of the selective discharge circuit 44.

The full bit precharge circuit 43 is constituted of transistors T0 through Tm whose drains are connected to the bit lines BL0 through BLm, respectively. An output terminal PCA of the precharge control circuit 46 is connected to the gates of transistors T0 through Tm. The selective precharge circuit 45 has transistors T10 through T1m whose drains are connected to the bit lines BL0 through BLm, respectively. Output terminals PC0 through PC7 of the precharge control circuit 46 are connected one after another to the gates of the transistors T10 through T1m. The selective discharge circuit 44 has transistors T20 through T2m whose sources are connected to the bit lines BL0 through BLm, respectively. Output terminals DC0 through DC7 of the discharge transistor select circuit 47 as a discharge control circuit are connected one after another to the gates of transistors T20 through T2m.

Figure 2:
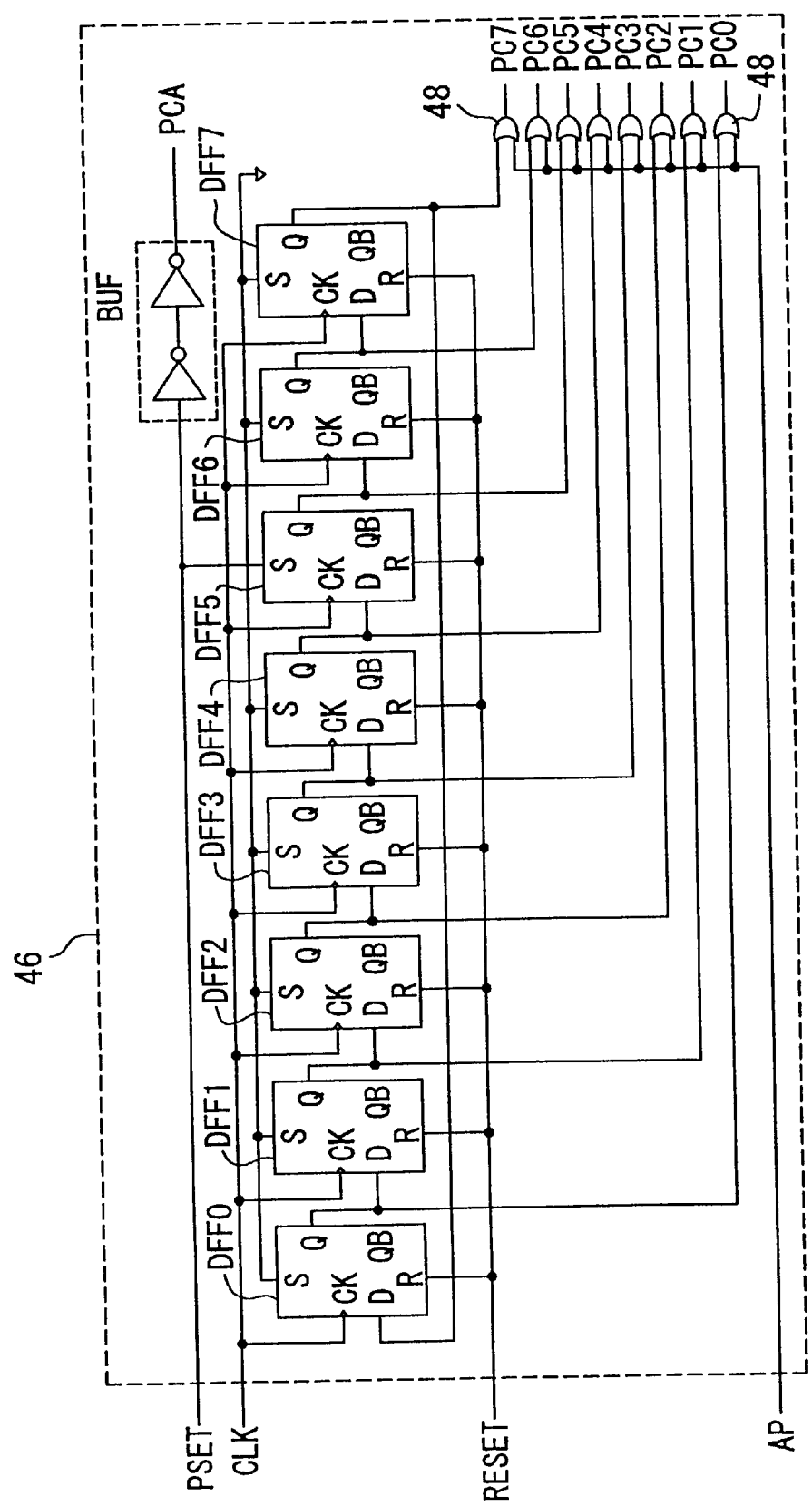
FIG. 2 is a block diagram of a precharge control circuit in FIG. 1.

FIG. 2 is a block diagram showing one example of the precharge control circuit 46. In FIG. 2 are shown D-type flip-flop circuits (hereinafter simply referred to as flip-flops) DFF0 through DFF7. A CLK signal (clock signal) is inputted to a terminal CK of each of flip-flops DFF0 through DFF7. The state of the signal being inputted to a terminal D is outputted to a terminal Q in accordance with the rise timing of the CLK signal, and the inverted level of the terminal Q is outputted from a terminal QB. It is to be noted that the fall timing of the CLK signal is possibly used instead of the rise timing of the CLK signal. If a terminal S is made to have "H" level, then the terminal Q is compulsorily made to have "H" level, and a terminal QB is compulsorily made to have "L" level. Further, if a terminal R is made to have "H" level, then the terminal Q is compulsorily made to have "L" level, and the terminal QB is compulsorily made to have "H" level. These states are maintained until the next rise of the clock signal. Alternatively, these states are passibly maintained until the next fall of the clock signal.

Further, in the precharge control circuit 46, a PSET signal is inputted to a terminal S of the flip-flop DFF5 and a buffer circuit BUF for outputting a PCA signal, and the RESET signal is inputted to the terminals R of the flip-flops DFF0 through DFF7. The terminal Q of each flip-flop DFF (DFF represents DFF0 through DFF7) is connected to one input terminal of an OR gate 48 whose output terminal is connected to any one of output terminals PC0 through PC7 and also connected to the terminal D of the adjacent flip-flop DFF. In the above case, the terminal Q of the flip-flop DFF7 of the final stage is connected to the terminal D of the flip-flop DFF0 in the forefront stage. It is to be noted that an AP signal is inputted to the other input terminal of the OR gate 48. Thus, all the flip-flops DFF0 through DFF7 are connected serially in a loop, constituting a shift register. By providing the connection as described above, the state of the terminal Q of each flip-flop DFF appears at the terminal Q of the flip-flop DFF of the subsequent stage every rise of the CLK signal.

Figure 4:
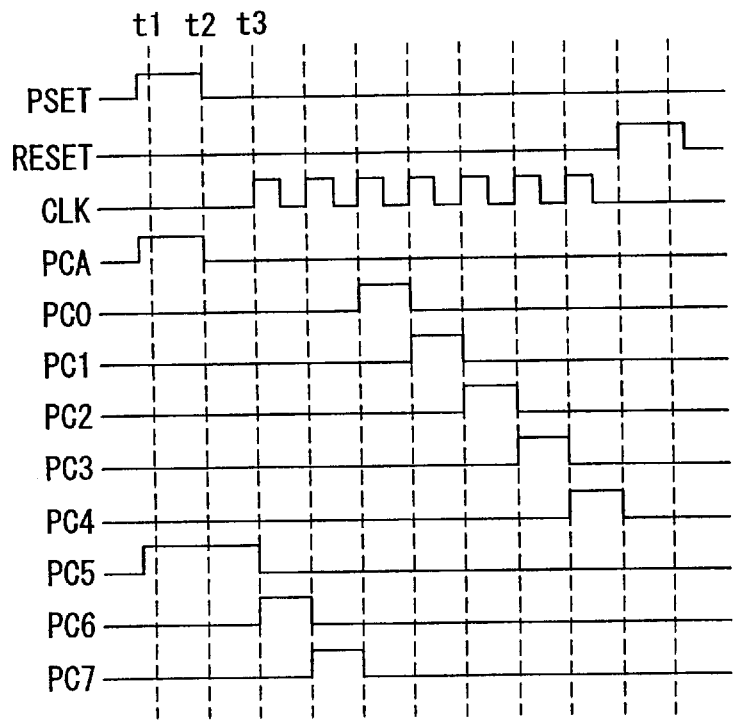
FIG. 4 is a timing chart of the operation of a precharge control circuit shown in FIG. 2.

FIG. 4 is a timing chart of the precharge control circuit 46 that has the aforementioned construction. The operation of the precharge control circuit 46 will be described with reference to FIG. 4. First of all, the AP signal is made to have "L" level. If the PSET signal is made to have "H" level, then a signal of "H" level is outputted from an output terminal PCA and an output terminal PC5, and a signal of "L" level is outputted from output terminals PC0 through PC4, PC6 and PC7. As a result, the gates of the transistors T0 through Tm that constitute the full bit precharge circuit 43 come to have "H" level, precharging all the bit lines BL0 through BLm. Thus, after a lapse of a specified period required for the precharging of all the bit lines, the PSET signal is made to have "L" level so as to make the PCA signal have "L" level. In the above case, the state of the output terminals PC0 through PC7 is maintained to the next rise of the CLK signal. The output state of the output terminals PC0 through PC7 at this time point is expressed by an 8-bit binary number of "00000100". Therefore, the transistor T15 whose gate is connected to the output terminal PC5 is turned on to selectively precharge only the bit line BL5.

When the CLK signal is simultaneously inputted to the terminals CK of the flip-flops DFF0 through DFF7, the state of the terminal Q of each flip-flop DFF appears at the terminal Q of the adjacent flip-flop DFF in accordance with the rise timing of the CLK signal. Consequently, the output state of the output terminals PC0 through PC7 expressed by the binary number is to be shifted rightward as follows:

"00000100"→"00000010"→"00000001"→"10000000"→
"01000000"→"00100000"→"00010000"→"00001000".

If the AP signal is made to have "H" level, then all the output terminals PC0 through PC7 come to have "H" level, by which all the bit lines BL0 through BLm are made prechargeable.

Figure 3:
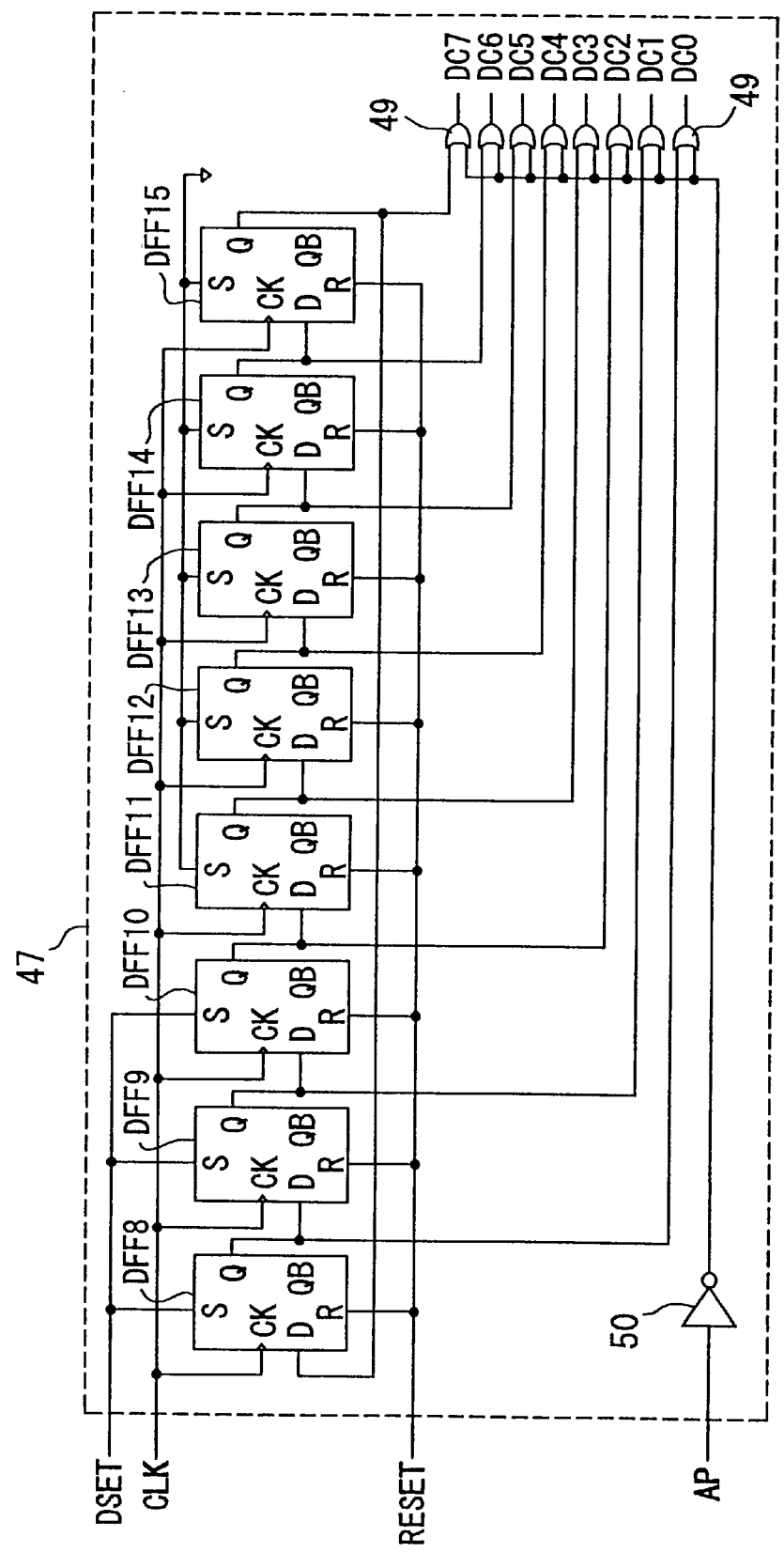
FIG. 3 is a block diagram of a discharge transistor select circuit in FIG. 1.

FIG. 3 is a block diagram showing one example of the discharge transistor select circuit 47 which serves as an example of a discharge control circuit. Similarly to the case of the precharge control circuit 46 shown in FIG. 2, there is provided a shift register, in which eight D-type flip-flop circuits (hereinafter simply referred to as flip-flops) DFF8 through DFF15 are serially connected. It is to be noted that a DSET signal, which corresponds to the PSET signal in the case of the precharge control circuit 46, is inputted only to the terminals S of the flip-flops DFF8 through DC10, and the terminals S of the flip-flops DFF11 through DFF15 are connected to GND. Furthermore, the AP signal inputted to the input terminal of an AND gate 49, whose output terminal is connected to any one of the output terminals DC0 through DC7, is inputted via a NOT gate 50.

Figure 5:
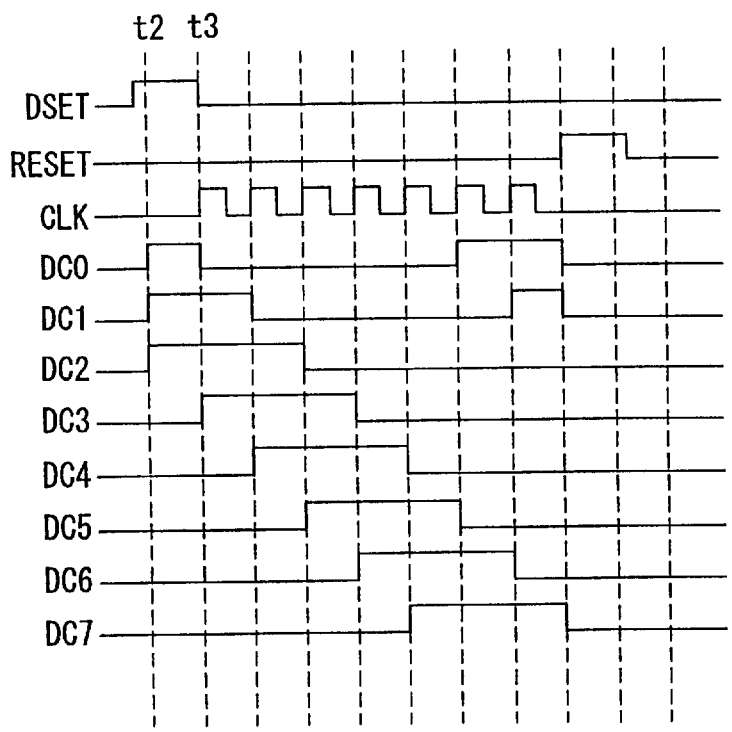
FIG. 5 is a timing chart of the operation of a discharge transistor select circuit shown in FIG. 3.

FIG. 5 is a timing chart of the discharge transistor select circuit 47 that has the aforementioned construction. The operation of the discharge transistor select circuit 47 will be described with reference to FIG. 5. First of all, the AP signal is made to have "L" level. When the full bit precharge circuit 43 completes the precharge of all the bit lines, the level of the DSET signal is made to have "H" level. Then, a signal of "H" level is outputted from the output terminals DC0 through DC2, while a signal of "L" level is outputted from the output terminals DC3 through DC7. In the above case, the state of the output terminals DC0 through DC7 is maintained to the next rise of the CLK signal. The output state of the output terminals DC0 through DC7 at this time point is expressed by an 8-bit binary number of "11100000".

Therefore, the transistors T20 through T22 whose gates are connected to the output terminals DC0 through DC2 are turned on to selectively discharge only the bit lines BL0 through BL2.

When the CLK signal is concurrently inputted to the terminals CK of the flip-flops DFF8 through DFF15, the output state of the output terminals DC0 through DC7 expressed by the binary number is to be shifted rightward in accordance with the rise timing of the CLK signal as follows:

"11100000"→"01110000"→"00111000"→"00011100"→
"00001110"→"00000111"→"10000011"→"11000001".

If the AP signal is made to have "H" level, then all the output terminals PC0 through PC7 come to have "L" level, by which the pull-down can be stopped.

The output state of the output terminals PC0 through PC7 expressed by the binary number in the precharge control circuit 46 is herein compared with the output state of the output terminals DC0 through DC7 expressed by the binary number in the discharge transistor select circuit 47 as a discharge control circuit. The output state of the precharge control circuit 46 at a time point t2 is "00000100" in FIG. 4, while the output state of the discharge transistor select circuit 47 at the time point t2 is "11100000" in FIG. 5. Therefore, it can be understood that the mutually adjoining three bit lines out of the eight bit lines in one block are selectively discharged by the discharge transistor select circuit 47, and the bit line located at the center of the remaining five bit lines is selectively precharged by the precharge control circuit 46. The output state of the precharge control circuit 46 at a time point t3 is "00000010" in FIG. 4, while the output state of the discharge transistor select circuit 47 at the time point t3 is "01110000" in FIG. 5. Therefore, likewise, the bit line located at the center of the five bit lines other than the adjoining three bit lines discharged selectively is precharged. The same operation is executed at the other time points.

Figure 6:
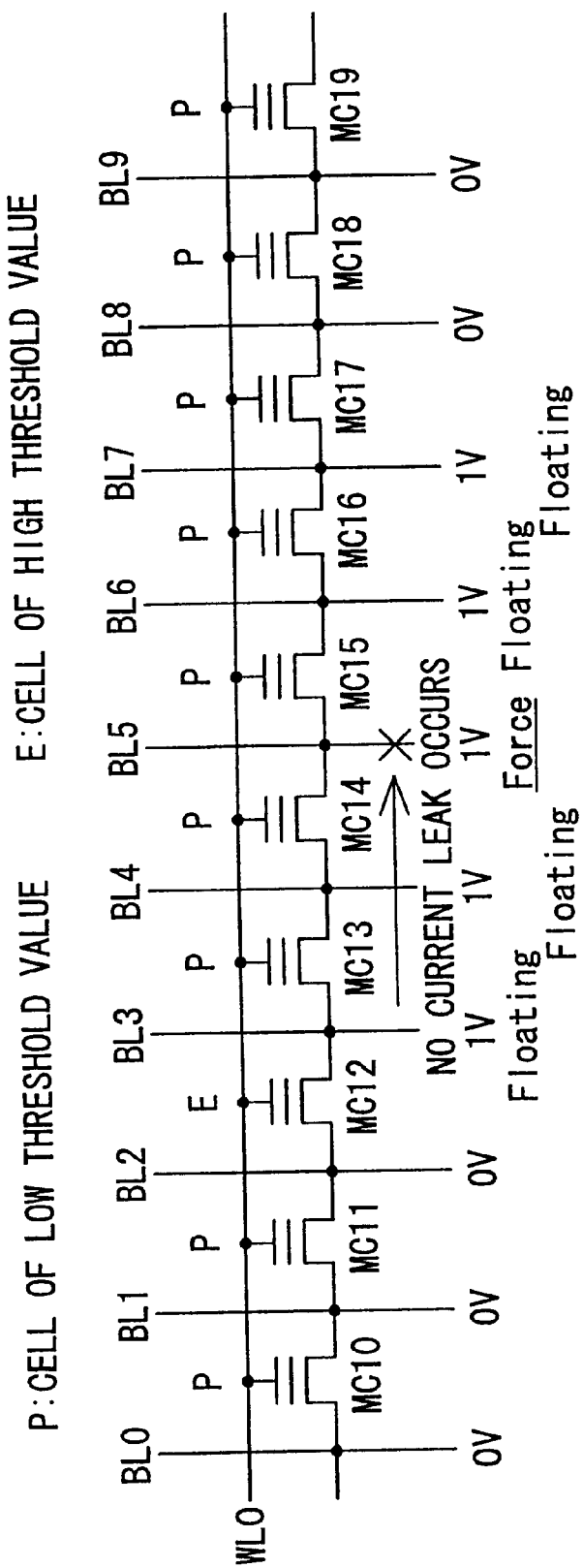
FIG. 6 is a diagram showing a pattern of voltages applied to bit lines during read.
Figure 7:
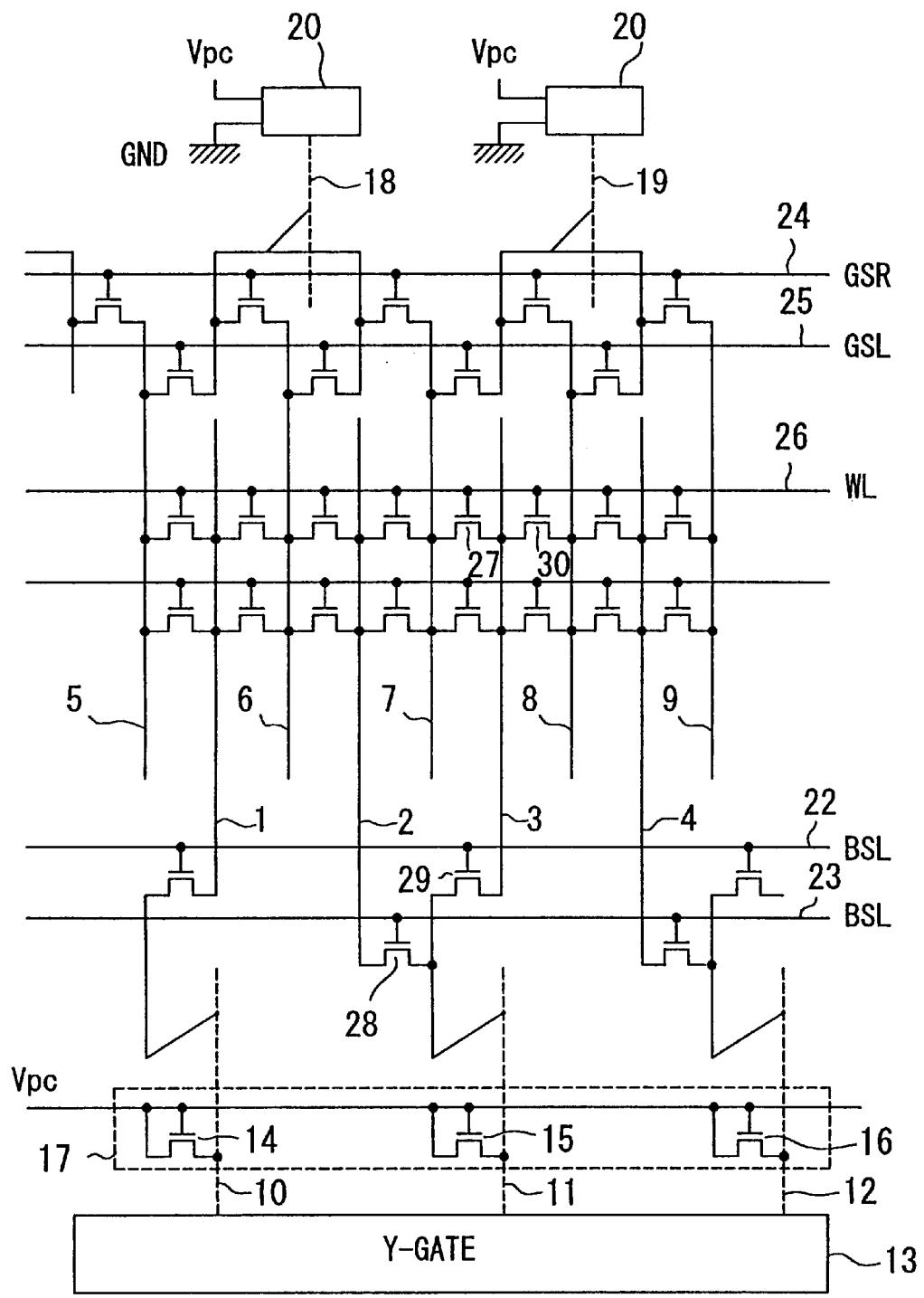
FIG. 7 is a block diagram of a conventional semiconductor storage device.
Figure 8:
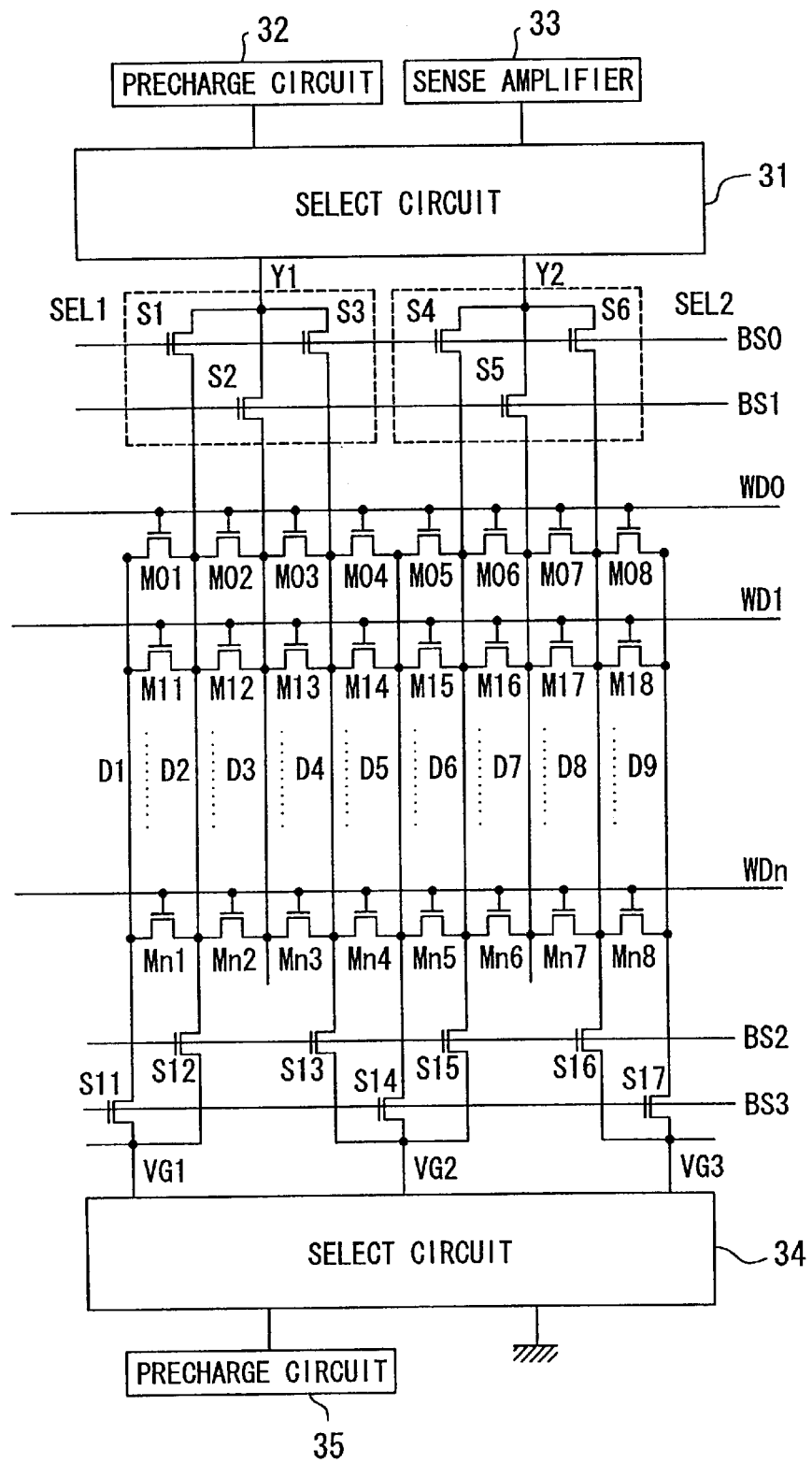
FIG. 8 a block diagram of a conventional semiconductor storage device different from that of FIG. 7.

FIG. 6 shows a pattern of voltages applied to the bit lines BL0 through BL9 when the memory cell MC12 shown in FIG. 1 is read. The operation of each section when the memory cell MC12 is selected in the aforementioned construction will be described below.

First of all, at the time point t1 in FIG. 4, the PSET signal supplied to the precharge control circuit 46 is made to have "H" level, making the full bit precharge signal PCA have "H" level and making all the bit lines BL0 through BLm have the precharge level Vp (1 V, for example). Next, at the time point t2 in FIGS. 4 and 5, the full bit precharge signal PCA is made to have "L" level, bringing all the bit lines BL0 through BLm into the floating state. In the above case, the precharge bit line select signal PC5 from the precharge control circuit 46 has "H" level, and therefore, only the bit line BL5 is fixed to the precharge potential Vp. Moreover, the DSET signal supplied to the discharge transistor select circuit 47 is made to have "H" level, making the discharge bit line select signals DC0 through DC2 have "H" level and making the three bit lines BL0 through BL2 have a potential of 0 V.

The voltage application pattern of the bit line BL at this time point t2 becomes as shown in FIG. 6. That is, in the present embodiment, the precharge voltage Vp is applied to the bit line BL5 located at the center of the five bit lines BL3 through BL7 other than the three bit lines BL0 through BL2 to be grounded out of the eight bit lines BL0 through BL7 in one block. By virtue of the above arrangement, no current leak occurs from the drain of the selected memory cell MC12 (bit line BL3) via the non-selected memory cells MC13 through MC17 even if the timing of the sense operation relevant to the selected memory cell MC12 is delayed for some factors when the threshold value of the selected memory cell MC12 is high and the threshold value of the other non-selected memory cells MC is low, as a consequence of which the potential of the drain is kept at the precharge potential. Therefore, the selected memory cell MC12 can correctly be read. When the threshold value of the selected memory cell MC12 is low and the threshold value of the other non-selected memory cells MC13, MC14, . . . is low too, electric charges are supplied to the drain of the selected memory cell MC12 (bit line BL3) via two non-selected memory cells MC13 and MC14 from the bit line BL5 to which the precharge voltage Vp is compulsorily applied. However, the bit line BL2 located on the source side of the selected memory cell MC12 is discharged to 0 V, and therefore, the potential of the bit line BL3 is pulled down to Vp/3. Therefore, the bit line BL3 comes to have a voltage lower than the precharge level of the bit line BL5, and the read can correctly be executed.

Next, the AP signal to the precharge control circuit 46 and the discharge transistor select circuit 47 is made to have "H" level, making all the bit lines BL0 through BLm have the precharge level Vp. Thereafter, the operating state shifts into the state at the time point t3 in FIGS. 4 and 5.

Subsequently, if the operation of the precharge control circuit 46 shown in FIG. 4 and the operation of the discharge transistor select circuit 47 shown in FIG. 5 are continued in synchronism, then the three bit lines BL to be grounded out of the eight bit lines BL0 through BL7 in one block are successively shifted rightward in the figure. At the same time, the four bit lines BL that are brought into the floating state by the precharge voltage Vp and the one bit line BL fixed to the precharge voltage Vp at the center thereof are successively shifted rightward in the figure.

As described above, the read in the nonvolatile semiconductor storage device of the virtual ground system is executed by discharging one (bit line BL2) of the two bit lines BL2 and BL3 connected to the selected memory cell MC12 and precharging the other one (bit line BL3). In the above case, the two bit lines BL0 and BL1, which are adjacent to the bit line BL2 on the discharged side, are also discharged in the present embodiment. Furthermore, the precharge voltage is applied to the bit line BL5 located at the center of the five bit lines BL3 through BL7 which are the bit line BL3 on the precharged side and the four bit lines BL4 through BL7 adjacent thereto.

In the above case, the designation of the three bit lines to be discharged is selectively controlled by the discharge transistor select circuit 47, while the designation of the bit line to which the precharge voltage is to be applied is selectively controlled by the precharge control circuit 46.

It is herein considered the case where the threshold value of the selected memory cell MC12 is high. In the above case, the bit line BL3 has the precharge level as described above. When the precharge voltage is not applied to the bit line BL5, the potential of the bit line BL3 is lowered by receiving the influence of the bit line BL8 discharged when the threshold value of the non-selected memory cells MC13 through MC17 is low. Therefore, the selected memory cell MC12 of the high threshold value is erroneously determined to be in the ON state instead of being properly determined to be in the OFF state. However, in the present embodiment, the precharge voltage is applied to the bit line BL5 located at the center of the five bit lines BL3 through BL7 that are not discharged. Therefore, the leak occurs only between the bit lines BL5 through BL8, and the influence on the bit line BL3 connected to the selected memory cell MC12 can be prevented.

Next, it is herein considered the case where the threshold value of the selected memory cell MC12 is low. In the above case, the bit line BL3 that has the precharge level as described above receives the influence of the bit line BL2 discharged before receiving the influence of the bit line BL5 to which the precharge voltage is selectively applied, rapidly lowering the precharge level Vp to Vp/3. Consequently, it is correctly determined that the selected memory cell MC12 is in the ON state. Therefore, the memory cell MC can correctly be read.

It is to be noted that a distance between the precharge voltage applied bit line BL6 and the discharged bit line BL8 located on the right-hand side in the figure is reduced when the precharge voltage is selectively applied to either one (bit line BL6, for example) of the two bit lines located on the right-hand side of the center bit line among the non-discharged five bit lines in the figure. Therefore, when the memory cells MC16 and MC17, which are located between the precharge voltage applied bit line BL6 and the discharged bit line BL8, have a low threshold value, the current leak from the precharge voltage applied bit line BL6 to the discharged bit line BL8 becomes increased. Consequently, the influence on the floating bit line BL3 connected to the selected memory cell MC12 is increased, possibly causing misread when the threshold value of the selected memory cell MC12 is high.

Conversely, when the precharge voltage is selectively applied to the bit line BL4 that is not subjected to sense among the two bit lines located on the left-hand side of the center bit line of the non-discharged five bit lines, the distance between the precharge voltage applied bit line BL4 and the selected memory cell MC12 is reduced. Therefore, when the memory cell MC13 located between the precharge voltage applied bit line BL4 and the floating bit line BL3 has a low threshold value, the influence of the electric charges on the floating bit line BL3 from the precharge voltage applied bit line BL4 becomes increased, possibly causing misread when the threshold value of the selected memory cell MC12 is low.

Therefore, in the present embodiment, the number of the non-discharged bit lines is set to an odd number, and the precharge voltage is applied to the bit line located at the center of the odd-number non-discharged bit lines. It is to be noted that the number of the discharged bit lines and the number of the non-discharged bit lines are not limited to the aforementioned numbers and, of course, allowed to be properly changed according to the specifications and the characteristics of the employed semiconductor storage device.

As is apparent from the above, the nonvolatile semiconductor storage device of the first inventive aspect charges all the bit lines by operating the full bit precharge means by the precharge control circuit during full bit precharge, selectively discharges the one or more adjoining bit lines that include either one of the two bit lines connected to the selected memory cell by operating the selective discharge means by the discharge control circuit in the read operation and selectively applies the precharge voltage to any one of the one or more bit lines adjacent to the other bit line out of the two bit lines connected to the selected memory cell by operating the selective precharge means by the precharge control circuit. Therefore, when the threshold value of the selected memory cell is high and the threshold value of the non-selected memory cell is low, the current leak from the drain of the selected memory cell via the non-selected memory cell can be prevented. Therefore, correct read can be executed.

When the threshold value of the selected memory cell is low and the threshold value of the non-selected memory cell is low, the precharge voltage of the other bit line out of the two bit lines connected to the selected memory cell is pulled down to one-third, for example, by the one discharged bit line. Therefore, the electric charges from the precharge voltage applied bit line exert no influence on the drain potential of the selected memory cell. Therefore, correct read can be executed.

That is, according to the present invention, the influence of the adjacent ON cell that shares the word line of the selected memory cell during read of the nonvolatile semiconductor storage device of the virtual ground system is removed, and the read margin can be improved.

Also, in one embodiment, the bit line to which the precharge voltage is applied by the selective precharge means is one bit line located at a center of the plurality of adjoining bit lines that include the other bit line. Therefore, the drain potential when the threshold value of the selected memory cell is high does not receive the influence of the current leak occurring from the precharge voltage applied bit line toward the discharged bit line via the non-selected memory cell, dissimilar to the case where the bit line to which the precharge voltage is applied is positioned on the opposite side of the selected memory cell with respect to the center of the plurality of adjoining bit lines that include the other bit line. The drain voltage when the threshold value of the selected memory cell is low does not receive the influence of the electric charges occurring from the precharge voltage applied bit line via the non-selected memory cell, dissimilar to the case where the precharge voltage applied bit line is positioned on the selected memory cell side with respect to the center.

Therefore, the read of the selected memory cell can be executed stably and accurately.

Moreover, according to the nonvolatile semiconductor storage device of the first inventive aspect, by constituting the full bit precharge means, the selective precharge means and the selective discharge means of the plurality of transistors connected to the bit lines and making the precharge control circuit and the discharge control circuit supply the control signal to the gates of the transistors that constitute the means, the above-mentioned means can be constituted of the same transistor array, allowing the areal reduction to be achieved. Furthermore, the selective discharge and the selective application of the precharge voltage to the bit lines can be executed in units of bit lines. Therefore, the number of the discharged bit lines, the number of the non-discharged bit lines and the position of the precharge voltage applied bit line can easily be changed only by changing the precharge control circuit or the discharge control circuit.

Moreover, the nonvolatile semiconductor storage device read method of the invention has the steps of precharging all the bit lines, selectively discharging the one or more adjoining bit lines that include either one bit line out of the two bit lines connected to the selected memory cell and selectively applying the precharge voltage to the one bit line located at the center of the plurality of adjoining bit lines that include the other bit line out of the two bit lines connected to the selected memory cell. Therefore, when the threshold value of the selected memory cell is high and the threshold value of the non-selected memory cell is low, the current leak from the drain of the selected memory cell via the non-selected memory cell can be prevented. Therefore, correct read can be executed. When the threshold value of the selected memory cell is low and the threshold value of the non-selected memory cell is low, the precharge potential of the other bit line is pulled down by the discharged one bit line before the drain potential of the selected memory cell receives the influence of the electric charges from the precharge voltage applied bit line. Therefore, correct read can be executed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile semiconductor storage device having a plurality of nonvolatile memory cells arranged in a matrix form and bit lines and word lines connected to the nonvolatile memory cells, the nonvolatile memory cells adjoining in a direction in which the word lines extend sharing one bit line, the device comprising:

a full bit precharge means for charging all the bit lines with electric charges;

a selective discharge means for selectively discharging one or more adjoining bit lines that include either one of two bit lines connected to a selected nonvolatile memory cell;

a selective precharge means for selectively applying a precharge voltage to any one of one or more bit lines adjacent to the other bit line of the two bit lines connected to the selected nonvolatile memory cell;

a precharge control circuit for operating the full bit precharge means during full bit precharge for charging all the bit lines and operating the selective precharge means in a read operation; and a discharge control circuit for operating the selective discharge means in the read operation.

2. A nonvolatile semiconductor storage device as claimed in claim 1, wherein the bit line to which the precharge voltage is applied by the selective precharge means is one bit line located at a center of the plurality of adjoining bit lines that include the other bit line.

3. A nonvolatile semiconductor storage device as claimed in claim 2, wherein the bit lines, which are selectively discharged by the selective discharge means, are three bit lines, and the plurality of bit lines, where the bit line to which the precharge voltage is applied by the selective precharge means is located at the center, are five bit lines.

4. A nonvolatile semiconductor storage device as claimed in claim 1, wherein each of the full bit precharge means, the selective precharge means and the selective discharge means is constituted of a plurality of transistors whose sources or drains are connected to the bit lines, the precharge control circuit supplies a control signal to gates of the transistors that constitute the full bit precharge means and the selective precharge means, and the discharge control circuit supplies a control signal to gates of the transistors that constitute the selective discharge means.

5. A method for reading a nonvolatile semiconductor storage device having a plurality of nonvolatile memory cells arranged in a matrix form and bit lines and word lines connected to the nonvolatile memory cells, the nonvolatile memory cells adjoining in a direction in which the word lines extend sharing one bit line, the method comprising the steps of:

precharging all the bit lines with electric charges;

activating a word line connected to a selected nonvolatile memory cell;

selectively discharging one or more adjoining bit lines that include either one of two bit lines connected to the selected nonvolatile memory cell;

selectively applying a precharge voltage to one bit line that is located at a center of a plurality of adjoining bit lines that include the other bit line of the two bit lines connected to the selected nonvolatile memory cell; and reading information stored in the selected nonvolatile memory cell from the other bit line.

* * * * *

UNITED STATES PATENT AND TRADEMARK OFFICE
CERTIFICATE OF CORRECTION

PATENT NO. : 6,487,124 B2
DATED : November 26, 2002
INVENTOR(S) : Atsushi Semi

It is certified that error appears in the above-identified patent and that said Letters Patent is hereby corrected as shown below:

<u>Title page, Item [54] and Column 1, line 4,</u>
After the word "METHOD", please add -- THEREFOR --.

Signed and Sealed this

Thirteenth Day of May, 2003

JAMES E. ROGAN
*Director of the United States Patent and Trademark Office*